United States Patent
Wu et al.

(10) Patent No.: US 9,676,919 B2
(45) Date of Patent: Jun. 13, 2017

(54) HYBRID CARBON BLACK AND COATING COMPOSITION

(71) Applicant: INDUSTRIAL TECHNOLOGY RESEARCH INSTITUTE, Hsinchu (TW)

(72) Inventors: Ching-Mao Wu, Keelung (TW); Szu-Yin Lin, Zhudong Township (TW); Ming-Tzung Wu, Mailiao Township (TW); Te-Yi Chang, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/064,830

(22) Filed: Mar. 9, 2016

(65) Prior Publication Data

US 2017/0088687 A1   Mar. 30, 2017

Related U.S. Application Data

(60) Provisional application No. 62/232,682, filed on Sep. 25, 2015.

(30) Foreign Application Priority Data

Dec. 10, 2015 (TW) .............................. 104141462 A (51) Int. Cl.
*G03F 7/004* (2006.01)
*C08K 3/04* (2006.01)
(Continued)

(52) U.S. Cl.
CPC .................. *C08K 3/04* (2013.01); *C08K 9/08* (2013.01); *C09C 1/56* (2013.01); *C09D 125/08* (2013.01);
(Continued)

(58) Field of Classification Search
CPC ...... G03F 7/004; G03F 7/0042; G03F 7/0007; C08K 3/04; C08K 9/08; C09C 1/56; C09D 125/08
(Continued)

(56) References Cited

U.S. PATENT DOCUMENTS 3,515,664 A * 6/1970 Johnson ................ B01D 57/02
                                                                204/627
6,197,274 B1   3/2001 Mahmud et al.
(Continued)

FOREIGN PATENT DOCUMENTS

TW   200619757 A   6/2006
TW   201525078 A   7/2015

OTHER PUBLICATIONS

Ching-Mao Wu et al., "Preparation of a Black Nanoparticle Used for Light Shielding", IDMC'13, Jan. 1, 2012, PH-06, 3 pages.
(Continued)

*Primary Examiner* — Amanda C Walke
(74) *Attorney, Agent, or Firm* — Birch, Stewart, Kolasch & Birch, LLP (57) ABSTRACT

A hybrid carbon black is provided, which includes a carbon black core and a polymer film wrapping an entire surface of the carbon black core. The polymer film includes a network of a plurality of polymer main chains crosslinked each other, and a plurality of dispersion-side chains bonded to the polymer main chains. The dispersion-side chains come from an acrylate monomer with a chemical structure of:

(Continued)

wherein when n is 4 to 7, $R^1$ is H or $CH_3$, and when n is 8 to 14, $R^1$ is $CH_3$.

9 Claims, 1 Drawing Sheet

(51) Int. Cl.
  *G03F 7/038* (2006.01)
  *G03F 7/00* (2006.01)
  *C09D 125/08* (2006.01)
  *C09C 1/56* (2006.01)
  *C08K 9/08* (2006.01)
(52) U.S. Cl.
  CPC .......... *G03F 7/0007* (2013.01); *G03F 7/0042* (2013.01); *G03F 7/038* (2013.01)
(58) Field of Classification Search
  USPC ........................................ 430/270.1; 106/472
  See application file for complete search history.

(56) References Cited

U.S. PATENT DOCUMENTS

| | | | |
|---|---|---|---|
| 6,372,349 | B1 | 4/2002 | Hisashi et al. |
| 6,376,577 | B2 | 4/2002 | Kniess et al. |
| 6,417,283 | B1 | 7/2002 | Ikeda et al. |
| 6,458,458 | B1 * | 10/2002 | Cooke ..................... C08K 9/08 428/403 |
| 8,088,718 | B2 | 1/2012 | Bicerano et al. |
| 8,435,425 | B2 | 5/2013 | Unagami et al. |
| 9,359,483 | B2 * | 6/2016 | Wu ........................... C09C 1/56 |
| 2005/0012979 | A1 * | 1/2005 | Minami ............... G02B 26/004 359/296 |
| 2008/0026221 | A1 | 1/2008 | Vincent et al. |
| 2011/0312859 | A1 | 12/2011 | Bicerano |
| 2012/0116012 | A1 | 5/2012 | Ganapathiappan et al. |
| 2015/0168746 | A1 * | 6/2015 | Blackman ................. C08F 2/08 252/583 |
| 2015/0183950 | A1 | 7/2015 | Wu et al. |

OTHER PUBLICATIONS

Dong-Guk Yu et al., "Preparation and Characterization of Acrylic-Based Electronic Inks by In Situ Emulsifier-Free Emulsion Polymerization for Electrophoretic Displays", Chemistry and Materials, 2004, vol. 16, No. 23, pp. 4693-4698.

Franca Tiarks et al., "Encapsulation of Carbon Black by Miniemulsion Polymerization", Macromolecular Chemistry and Physics, 2001, vol. 202, No. 1, pp. 51-60.

H.L. Guo et al., "Preparation of a kind of red encapsulated electrophoretic ink", Optical Materials, 2004, vol. 26, pp. 297-300.

Katharina Landfester et al., "Evidence for the preservation of the particle identity in miniemulsion polymerization", Macromol. Rapid Commun., 1999, vol. 20, No. 2, pp. 81-84.

Nico Steiert et al., "Encapsulation of Organic Pigment Particles via Miniemulsion Polymerization", Macromolecular Materials and Engineering, 2007, vol. 292, pp. 1111-1125.

Ting Wen et al., "Pigment-based tricolor ink particles via miniemulsion polymerization for chromatic electrophoretic displays", Journal of Materials Chemistry, 2010, vol. 20, pp. 8112-8117.

Taiwanese Office Action and Search Report, dated Jun. 7, 2016, for Taiwanese Application No. 104141462.

* cited by examiner

HYBRID CARBON BLACK AND COATING COMPOSITION

CROSS REFERENCE TO RELATED APPLICATIONS

This application claims the benefit of U.S. Provisional Application No. 62/232,682, filed on Sep. 25, 2015, and claims priority from Taiwan Application Serial Number 104141462, filed on Dec. 10, 2015, the disclosure of which is hereby incorporated by reference herein in its entirety.

TECHNICAL FIELD

The technical field relates to a hybrid carbon black, and in particular it relates to a coating composition including the hybrid carbon black.

BACKGROUND

A light-shielding border is disposed on the surface of a conventional touch panel, wherein the light-shielding border can be a black matrix photoresist layer. The black matrix photoresist layer is formed by providing a composition including carbon black dispersed within a photosensitive resist, coating the composition on a glass substrate, and subjecting the composition to a lithography process (i.e. soft baking, exposure, development, and hard baking). Although the carbon black has advantages such as low cost and high blackness, the black matrix photoresist layer including carbon black exhibits low surface resistance after hard baking at high temperatures, resulting in short circuits among wire traces disposed on the border and a distortion of the signal due to the electrical conductivity of carbon black. As such, the black colorant of the black matrix photoresist layer should be a carbon black with a highly insulative surface.

On the other hand, a hybrid carbon black such as a carbon black wrapped by a polymer film easily gels, thereby increasing the viscosity of the photoresist composition including the hybrid carbon black. Accordingly, a novel hybrid carbon black that will avoid gelling is called for.

SUMMARY

One embodiment of the disclosure provides a hybrid carbon black comprising: a carbon black core; and a polymer film wrapping an entire surface of the carbon black core, wherein the polymer film includes a network of a plurality of polymer main chains crosslinked each other, and a plurality of dispersion-side chains bonded to the polymer main chains, wherein the dispersion-side chains come from an acrylate monomer with a chemical structure of:

wherein when n=4-7, $R^1$ is H or $CH_3$; and when n=8-14, $R^1$ is $CH_3$.

One embodiment of the disclosure provides a coating composition comprising the described hybrid carbon black.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
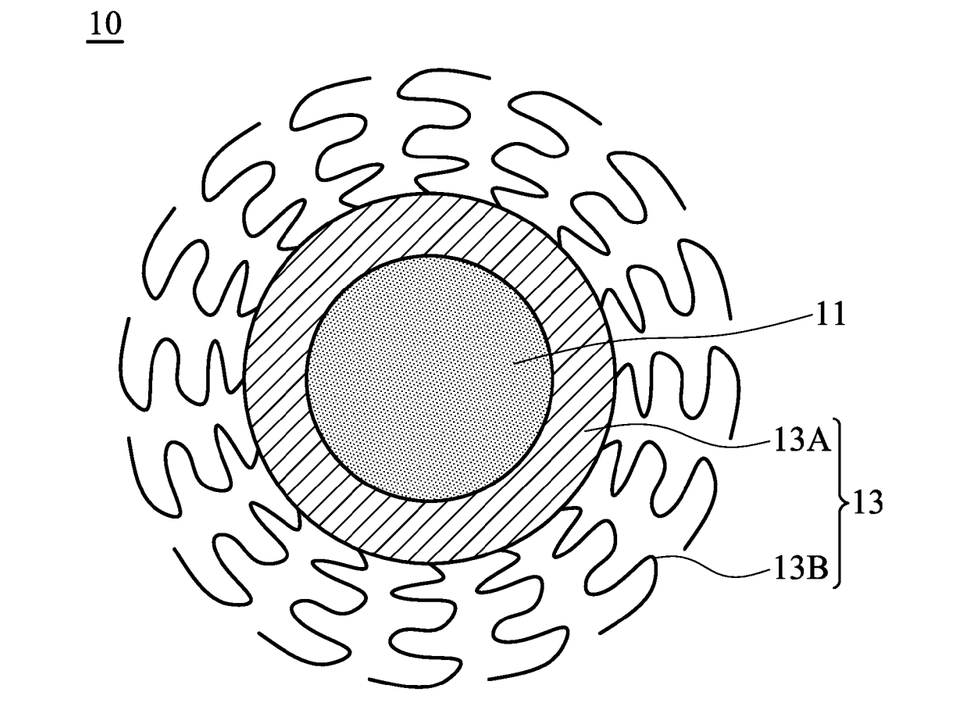
FIG. 1 shows a schematic diagram of hybrid carbon black in one embodiment of the disclosure.

As shown in FIG. 1, a hybrid carbon black 10 in one embodiment includes a polymer film 13 wrapping the entire surface of a carbon black core 11, and the polymer film 13 includes a network of a plurality of polymer main chains 13A crosslinking each other, and a plurality of dispersion-side chains 13B bonded to the polymer main chains 13A. The hybrid carbon black has a high thermal decomposition temperature and an excellent solvent resistance, such that the hybrid carbon black used in a shielding material will not easily decompose at a high temperature, and thus the surface of the carbon black of the hybrid carbon black is not exposed to maintain an electrical insulation. In addition, when the hybrid carbon black is formulated to a coating composition (e.g. a black ink), an organic solvent only swells other than dissolves the polymer film.

The carbon black core may have a compact fractal morphology and a very smooth surface. The compact fractal morphology of the carbon black core can be characterized by the fractal dimensions such as a mass fractal dimension (Dm) and a surface fractal dimension (Ds). The surface fractal dimension (Ds) represents a surface roughness of the fractal, and the carbon black core may have a surface fractal dimension (Ds) of 2 to 3. When the carbon black core has a low surface fractal dimension, the carbon black core has a smooth fractal surface. On the other hand, when the carbon black core has a high surface fractal dimension, the carbon black core has a rough fractal surface. The mass fractal dimension (Dm) represents an aggregation morphology of the fractal, and the carbon black core may have a mass fractal dimension (Dm) of 1 to 3. When the carbon black core has a low mass fractal dimension, the carbon black core has a linear aggregation morphology. On the other hand, when the carbon black core has a high mass fractal dimension, the carbon black core has a compact fractal morphology (closed spherical morphology). In one embodiment, the carbon black core can have a mass fractal dimension (Dm) between 2-3 and a surface fractal dimension (Ds) between 2-2.5.

In one embodiment, the polymer film is polymerized of a styrene monomer, a crosslinking agent, and an acrylate monomer. The styrene monomer is apt to be adsorbed on the surface of the carbon black, thereby having an excellent interaction with the carbon black. Furthermore, the styrene monomer may enhance the thermal decomposition temperature of the polymer film. In one embodiment, the styrene monomer has a single ethylene group, which can be styrene, benzyl methacrylate, or benzyl acrylate.

The crosslinking agent has at least two ethylene groups for crosslinking the polymer main chains to be network. For example, the crosslinking agent can be divinyl benzene, ethylene glycol dimethacrylate, 1,4-butanediol diacrylate, pentaerythritol triacrylate, ethoxylated trimethylpropane triacrylate, dipentaerythritol pentaacrylate, ethoxylated pentaerythritol tertaacrylate, pentaerythritol tertaacrylate, dipentaerythritol hexaacrylate, or a combination thereof. In one embodiment, the crosslinking agent is divinyl benzene.

After the polymerization, the acrylate monomer forms dispersion-side chains bonded to the polymer main chains. The dispersion-side chains may reduce the ink viscosity and enhance the dispersity. In one embodiment, the acrylate monomer has a chemical structure as Formula 1.

(Formula 1)

In Formula 1, when n=4-7, $R^1$ is H or $CH_3$. When n=8-14, $R^1$ is $CH_3$. Note that if n is greater than 7 and $R^1$ is H, a viscosity of a composition containing the hybrid carbon black will be dramatically increased. On the other hand, if n is greater than 14, a viscosity of the composition containing the hybrid carbon black cannot be decreased by an acrylate with $R^1$ being $CH_3$. In one embodiment, the acrylate monomer is lauryl methacrylate (LMA). In one embodiment, the acrylate monomer is hexyl methacrylate (HMA). In one embodiment, the acrylate monomer is hexyl acrylate (HA).

In one embodiment, the styrene monomer and the crosslinking agent have a molar ratio of about 70:1 to 100:1. The polymer main chains cannot be sufficiently crosslinked by an overly low ratio of the crosslinking agent, thereby failing to form a polymer film wrapping an entire surface of the carbon black. An overly high ratio of the crosslinking agent makes the polymer film has an overly hardness (brittle). In one embodiment, the styrene monomer and the acrylate monomer have a molar ratio of 17:1 to 23:1. An overly low ratio of the acrylate monomer makes a black photoresist liquid has an overly high viscosity. An overly high ratio of the acrylate monomer may result in the dispersion-side chains losing their dispersion functions, thereby gelling the hybrid carbon black.

In one embodiment, the polymer film and the carbon black core have a weight ratio of 5:1 to 30:1. An overly high ratio of the polymer film causes a film containing the hybrid carbon black has an overly low optical density. An overly low ratio of the polymer film cannot efficiently shield the carbon black, such that a film containing the hybrid carbon black has an overly low surface resistance. In one embodiment, a thickness of the polymer film and a diameter of the carbon black core have a ratio of 0.5:1 to 1.5:1. An overly thick polymer film causes a film containing the hybrid carbon black has an overly low optical density. An overly thin polymer film cannot efficiently shield the carbon black, such that a film containing the hybrid carbon black has an overly low surface resistance. In one embodiment, the hybrid carbon black has an average diameter of 40 nm to 150 nm, e.g. 80~130 nm. An overly large hybrid carbon black has an overly large space between the hybrid carbon black, thereby lowering the optical density and the shielding effect of a black photoresist liquid containing the hybrid carbon black. An overly small hybrid carbon black makes a black photoresist liquid containing the same has an overly high viscosity, thereby negatively influencing its coating factors.

The hybrid carbon black can be prepared by (1) pulverizing the carbon black and (2) synthesizing the hybrid carbon black. First, a carbon black is pulverized by formulating a carbon black dispersion and grinding the dispersion. The grinding process can be ball milling, sand-milling, high-speed impact mill, or the like. In one embodiment, the carbon black is pulverized by a nano-grinding process, in order to force the obtained carbon black core having a specific mass fractal dimension (Dm) and surface fractal dimension (Ds).

In one embodiment, the carbon black can be pulverized by following these steps. First, a bare carbon black is provided and then washed several times with tetrahydrofuran (THF) to remove the dirt on the surface of the carbon black. Next, the carbon black, a first surfactant, and water are mixed to obtain a carbon black/first surfactant/water dispersion with a solid content of 9 wt % to 15 wt %. After stirring at 50 rpm to 100 rpm for 20 to 30 minutes, the dispersion is put into a nano-grinding mill for a further nano-grinding process. The nano-grinding process can employ ceramic grinding beads (such as spherical zirconium oxide beads with a high-density, high hardness, high stability, and high abrasion resistance), or steel grinding beads (such as tempering steel beads, chrome-steel alloy beads, or hardened bearing steel beads), having a diameter less than or equal to 0.1 mm. The nano-grinding process can be performed at a temperature of 15° C. to 25° C. The nano-grinding process can be performed with an initial rate of 500 rpm to 1500 rpm, which is gradually increased to a rate of 1500 rpm to 2500 rpm. The nano-grinding process is carried out until the particle size change was reduced to within a prescribed range. After the nano-grinding process, the dispersion can be centrifuged, and the centrifuged solid is washed several times using methanol. After drying at a low pressure, a fine carbon black powder can be obtained for preparing the hybrid carbon black. If the diameter of the grinding beads is too large, the ground carbon black will have a large particle size and a broad particle size distribution. If the grinding rate of the nano-grinding process is too high, the wetting ability provided by the surfactant would be poor, thereby resulting in over grinding. Conversely, if the grinding rate of the nano-grinding process is too low, the collision force between the carbon black is reduced, thereby resulting in a poor grinding performance. The first surfactant serves as a dispersant for dispersing and stabilizing the carbon black in water. Therefore, in the subsequent process, the monomers adsorbed on the carbon black may polymerize in a stable micelle to form a polymer chain, and the polymer chain may further crosslink to form a network like the polymer film does. The first surfactant type is not limited. The first surfactant can be anionic surfactant, cationic surfactant, non-ionic surfactant, or polymeric surfactant, such as sodium dodecyl sulfate (SDS). Furthermore, the dispersion can further include a second surfactant different from the first surfactant, such as a hydrophobic surfactant, in order to suppress Ostwald ripening of the micelle composed of the surfactant, monomer composition, and carbon black, thereby preventing the carbon black from having a broad particle size distribution. The second surfactant type is not limited, which can be a surfactant compatible with the first surfactant (e.g. hexadecane).

In one embodiment, the hybrid carbon black can be prepared as described below. A carbon black dispersion is formed by adding the aforementioned pulverized carbon black into an aqueous solution having a surfactant. After stirring, a stable carbon black dispersion is obtained. Next, a styrene monomer, a crosslinking agent, an acrylate monomer, and an initiator are filled into another container, and then stirred to form a homogeneous monomer solution, which is then added into the carbon black dispersion. Note that the mixture should be stirred continuously for a period of about 30 to 40 minutes in order to facilitate the monomer passing into the carbon black micelle and being adsorbed onto the surface of the carbon black. Last, the polymerization is performed, which can be fine-tuned according to the type of initiator. The initiator can be a thermal initiator or a photo initiator. When the initiator is a thermal initiator, the mixture is heated over the thermal decomposition temperature (e.g. 65° C. to 70° C.) of the thermal initiator under nitrogen to start the polymerization. In the last period of the polymerization, the temperature can be heated to be higher (e.g. 75° C. to 85° C.) to completely react the monomers. The total polymerization period can be between 2 and 20 hours. If the reaction temperature of the polymerization is too high, the initiator will immediately decompose, resulting in a cross-reaction of the monomer and the micelle of the carbon black. On the other hand, if the reaction temperature of the polymerization is too low, the initiator will not be fragmented by thermal decomposition. Note that the fragments of the thermal initiator cannot increase the electrical conductivity of the crosslinking network of the polymer film, in order to ensure that the obtained hybrid carbon black maintains electrical insulation. Accordingly, the use of the thermal initiator should match the monomers. The thermal initiator can be general 2,2'-azodi-isobutyronitrile (AIBN). The surfactant can be but not limited to an anionic surfactant, a cationic surfactant, a non-ionic surfactant, or a polymeric surfactant. In general, the surfactant can be sodium dodecyl sulfate (SDS) with a high hydrophilic-lipophilic balance (HLB) value. After polymerization, the synthesized hybrid carbon black is mixed with an appropriate amount of methanol, loaded into centrifuge bottles in a batch, and centrifuged in a centrifuge machine. After centrifugation, the upper liquid is removed, and fresh methanol is then filled to repeat the centrifugation. The above step is repeated several times to ensure that the surfactant is completely washed out. Next, the completely washed hybrid carbon black is collected from the bottom of the centrifuge bottles, and then vacuum dried to obtain a hybrid carbon black powder.

The hybrid carbon black can be used in a coating composition. In one embodiment, the coating composition may include a solvent, and the solid content of the hybrid carbon black can be 15 wt % to 30 wt % (in which the average diameter of hybrid carbon black in the dispersion=170~250 nm). The solvent can be any solvent in which the hybrid carbon black can disperse, such as propylene glycol monomethyl ether acetate (PGMEA), cyclohexanone, propylene glycol, or propylene glycol methyl ether (PGME). In addition, the coating composition may further include a dispersant such as olefin carboxylic acid (e.g. BYK-108), acrylic copolymer (e.g. BYK-116), polyamide of unsaturated polyamino acid (e.g. BYK-130), copolymer with colorant affinity groups (e.g. BYK-163, 164, 167, 170, 171, 174, 182, 183, 184, 185, 191, 192, 9075, 9076, 9077), acrylic acid copolymer (e.g. BYK-2000, 2001), or acrylate copolymer (e.g. BYK-2050, 2070). In particular, the dispersant has a weight percentage of 1 wt % to 30 wt %, based on the total weight of the solvent and the hybrid carbon black.

In one embodiment, the coating composition can be collocated with a negative type photoresist to form a light shielding coating. In one embodiment, the coating composition serving as the light shielding coating has a viscosity that is less than 20 cP, e.g. less than or equal to 10 cP and greater than 0 cp. The negative type photoresist includes 5 wt % to 40 wt % of a multifunctional monomer. The multifunctional monomer has at least two carbon-carbon double bonds. For example, the multifunctional monomer can be an acrylate monomer such as ethylene glycol dimethacrylate, 1,4-butanediol diacrylate, diethylene glycol diacrylate, pentaerythritol triacrylate, ethoxylated pentaerythritol triacrylate, dipentaetrythritol pentaacrylate, ethoxylated pentaerythritol tetraacrylate, pentaerythritol tetraacrylate, dipentaerythritol hexaacrylate, or the like.

The negative type photoresist also includes 20 wt % to 60 wt % of binder for crosslinking with the multifunctional monomer to form a network structure. The binder has a weight average molecular weight of 3,000 to 100,000 and an average polymerization degree of 1.2 to 4.3. In one embodiment, the binder has a weight average molecular weight of 6,000 to 40,000 and an average polymerization degree of 1.2 to 3.8. The binder can be dissolved in water or alkaline solution, which has 10 mol % to 50 mol % (or 15 mol % to 30 mol %) of a monomer with acid group. The binder also has unsaturated ester to crosslink with the multifunctional monomer for improving the coating ability of the binder, the adherence between the substrate and the binder, and the glass transfer temperature of the binder. The unsaturated ester includes methacrylate such as methyl methacrylate, benzyl methacrylate, ethyl methacrylate, 2-hydroxyethyl methacrylate, hydroxypropyl methacrylate, isobutyl methacrylate, or the like, or acrylate such as methyl acrylate, benzyl acrylate, ethyl acrylate, 2-hydroxyethyl acrylate, hydroxypropyl acrylate, isobutyl acrylate, or the like.

The binder and the multifunctional monomer are crosslinked by radical polymerization such as thermal polymerization or photo polymerization. The photo initiator is sensitive to UV with a wavelength of less than 400 nm. The photo initiator may occupy 0.1 wt % to 10 wt % of the negative type photoresist. The photo initiator can be acetophenone such as 2-methyl-1-(4-(methylthio)phenyl)-2-morpholino-propane, 1-hydroxycyclohexyl phenyl ketone, diethoxyacetophenone, 2-hydroxy-2-methyl-1-phenyl-propane-1-one, 2-benzyl-2-(dimethylamino)-1-[4-(morpholinyl)phenyl]-1-butanone, or the like, benzoin such as benzoin, benzoin methyl ether, or the like, diphenylketone such as benzophenone, 4-phenyl benzophenone, hydroxyl benzophenone, or the like, thioxanthone such as isopropyl thioxanthone, 2-chlorothioxanthone, or the like, anthraquinone such as 2-ethylanthraquinone or the like. The photo initiator can be used alone or in a combination for a faster photosensitive speed. For example, the isopropyl thioxanthone and the 2-benzyl-2-(dimethylamino)-1-[4-(morpholinyl) phenyl]-1-butanone can be combined.

The thermal initiator has a thermal decomposition temperature of 30° C. to 200° C. The thermal initiator may occupy 0.01 wt % to 1 wt % of the negative type photoresist. The thermal initiator can be an azo compound such as 2,2'-azobis(2,4-dimethyl valeronitrile), dimethyl 2,2'-azobis (2-methylpropionate), 2,2-azobisisobutyronitrile (AIBN), 2,2-azobis(2-methylisobutyronitrile), 1,1'-azobis(cyclohexane-1-carbonitrile), 2,2'-azobis[N-(2-propenyl)-2-methylpropionamide], 1-[(cyano-1-methylethyl)azo]formamide, 2,2'-azobis(N-butyl-2-methylpropionamide), 2,2'-azobis(N-cyclohexyl-2-methylpropionamide), or the like, a peroxide compound such as benzoyl peroxide, 1,1-bis(tert-butylperoxy)cyclohexane, 2,5-bis(tert-butylperoxy)-2,5-dimethylcyclohexane, 2,5-bis(tert-butylperoxy)-2,5-dimethyl-3-cyclohexyne, bis(1-(tert-butylpeorxy)-1-methy-ethyl)benzene, tert-butyl hydroperoxide, tert-butyl peroxide, tert-butyl peroxybenzoate, cumene hydroperoxide, cyclohexanone peroxide, dicumyl peroxide, lauroyl peroxide, or the like. The thermal initiator can be used alone or in a combination if necessary.

The negative type photoresist not only includes the multifunctional monomer, the binder, and the initiator, but it also includes 1 to 10 wt % of additives such as a curing accelerator, a surfactant, a leveling agent, a defoaming agent, a hard filler, or an adhesive promoter.

Below, exemplary embodiments are described in detail with reference to the accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

In following Examples, the particle size was measured by a high concentration particle size, zeta potential and molecular weight laser sizer (Malvern Zetasizer nanov5, Nano ZS). The morphology of the carbon black was measured by small angle X-ray scattering (Bruker Nanostar SAXS). The viscosity was measured by a viscometer (BROOKFIELD LVDV-II+P)

Preparation Examples

Preparation Example 1 (Carbon Black Pulverized by Nano-Grinding)

An appropriate amount of bare carbon black (MOGUL L, commercially available from Cabot) was weighed, washed several times with THF, and baked to dry for removing dirt on the surface of the carbon black. Subsequently, sodium dodecyl sulfate (SDS, commercially available from ACROS) was selected as dispersant to formulate a dispersion of carbon black, SDS, and water with a solid content of about 13 wt %. The dispersion was stirred at a controlled temperature at a rate of 50 rpm for 30 minutes, and then poured into a nano-grinding mill (Just Nano, JBM-B035) in a batch. Zirconium beads having a diameter of 0.1 mm serving as grinding balls were also put into a grinding tank of the mill. The stirred dispersion was then pulverized by nano-grinding. The grinding step was performed with a low initial grinding rate (500 rpm) at a grinding temperature of 20° C., which was gradually increased to 2000 rpm until the diameter of the carbon black was not dramatically changed. The aqueous solution of the pulverized carbon black was centrifuged to collect the pulverized carbon black, which was then washed several times using methanol, and then vacuum dried to obtain the pulverized carbon black. The pulverized carbon black had an average diameter of about 109 nm, a Dm of 2.3, and a Ds of about 2.0. This means that the pulverized carbon black had a compact fractal morphology and a very smooth surface.

Preparation Example 2 (Negative Type Photoresist Liquid)

(1) Preparing an Acrylic Binder

First, 160 g of propylene glycol monomethyl ether acetate (PGMEA, commercially available from Sigma-Aldrich) was put into a reaction bottle (4 L), heated to 90° C. under nitrogen, and stirred at a rate of 350 rpm. Subsequently, 0.8 g of AIBN (commercially available from Showa), 0.81 g of thiol (commercially available from Sigma-Aldrich), 60.01 g of benzyl methacrylate (BzMa, commercially available from Sigma), 26 g of methyl acrylic acid (MAA, commercially available from Sigma-Aldrich), 10 g of 2-hydroxyethyl methacrylate (2-HEMA, commercially available from Sigma-Aldrich), 40.02 g of methyl methacrylate (MMA), and 40 g of PGMEA were mixed and then dropwise and gradually added into the PGMEA in the reaction bottle. After the dropwise addition, the mixture was reacted for a further 2 hours to obtain an acrylic binder solution with a solid content of 38.72%.

(2) Preparing Photoresist Liquid 300 g of the acrylic binder solution, 50 g of dipentaerythritol hexaacrylate (DPHA, commercially available from Sartomer), and 20 g of photo initiator (OXE-02, commercially available from CIBA) were dissolved in 300 g of a co-solvent of PGMEA and isopropyl alcohol (w/w=9/1), thereby preparing a photoresist liquid with a viscosity of 5.94 cP.

Example 1 (Hybrid Carbon Black CB-LMA)

200 g of de-ionized water, 2.12 g of the pulverized carbon black from Preparation Example 1, and 2.78 g of SDS were put into a reaction bottle (250 mL) to be stirred and mixed to formulate a carbon black dispersion. Subsequently, 0.18 g of AIBN (purity=99%, commercially available from Showa), 2.21 g of lauryl methacrylate (LMA, commercially available from Aldrich), 21.1 g of styrene (commercially available from ACROS), and 0.38 g of 1,2-divinylbenzene (DVB, commercially available from TCI) were put into a flask to be stirred for forming a homogeneous phase, and then directly poured into the carbon black dispersion to form a mixture. The mixture was heated to 65° C. and reacted at 65° C. for 1 hour under nitrogen, and then heated to 75° C. and reacted at 75° C. for 16 hours, thereby obtaining a hybrid carbon black dispersion, wherein the surface of the carbon black was wrapped by a polymer film. The polymer film had polymer main chains (styrene-DVB-LMA copolymer) crosslinked as a network structure, and the dispersion-side chains (long alkyl group) formed of the LMA were bonded to the polymer main chains. The hybrid carbon black dispersion had a solid content of 15.7 wt %, and the hybrid carbon black in the hybrid carbon black dispersion had an average diameter of 107 nm. The hybrid carbon black dispersion was further purified and dried to get hybrid carbon black powder by following these steps. The hybrid carbon black dispersion was mixed with methanol and then loaded to centrifuge bottles in a batch. The centrifuge bottles was put into a centrifuge (HERMLE Z300) and then centrifuged by 4500 rpm for 10 minutes. The upper liquid in the centrifuge bottles was removed, and fresh methanol was then filled into the centrifuge bottles to repeat the centrifuge process. The centrifuge washing was repeated several times until the solid in the bottom of the centrifuge bottles had a Zeta potential close to 0 (measured by Malvern Zetasizer nanov5 (Nano ZS)) to ensure the SDS was completely washed out. The completely washed hybrid carbon black was collected from the centrifuge bottles and vacuum dried, thereby obtaining a hybrid carbon black powder (CB-LMA). The polymer film was polymerized in the following monomer ratios: the styrene and the DVB had a molar ratio of 70/1, and the styrene and the LMA had a molar ratio of 23/1.

Example 1-1 (Hybrid Carbon Black Dispersion of CB-LMA)

The hybrid carbon black in Example 1 was used to formulate a carbon black dispersion by a colorant dispersing method. First, 4 g of the hybrid carbon black (CB-LMA), 4 g of the dispersant (BYK 191), and 20 g of organic solvent (PGMEA) were put into a PE grinding can with a half volume filled by zirconium balls (diameter=0.05 mm). The grinding can was loaded on a ball-milling machine to mix and disperse the mixture therein for obtaining a hybrid carbon black dispersion. The hybrid carbon black dispersion had a total solid content of 28.6 wt %, and a hybrid carbon black solid content of 15 wt %. The Zeta surface potential was close to 0, which was determined by Malvern Zetasizer nanov5 (Nano ZS). In the hybrid carbon black dispersion, the hybrid carbon black had an average diameter of 206 nm. The hybrid carbon black dispersion had a viscosity of 14.4 cP.

Example 1-2 (Black Photoresist Liquid of CB-LMA)

The hybrid carbon black in Example 1 was used to formulate a black photoresist liquid by a colorant dispersing method. First, 4 g of the hybrid carbon black (CB-LMA) and 20 g of the negative type photoresist liquid were put into a PE grinding can with a half volume filled by zirconium balls (diameter=0.05 mm). The grinding can was loaded on a ball-milling machine to mix and disperse the mixture therein for obtaining a black photoresist liquid. The black photoresist liquid had a total solid content of 30 wt %, and a hybrid carbon black solid content of 15 wt %. In the black photoresist liquid, the hybrid carbon black had an average diameter of 228 nm. The black photoresist liquid had a viscosity of 8.88 cP when the viscometer rotated at 50 rpm. The black photoresist liquid had a viscosity of 9.00 cP when the viscometer rotated at 20 rpm.

Example 2

Example 2 was similar to Example 1, with a difference being that the styrene/DVB molar ratio was changed to 100/1. The other starting material amounts and processing factors in Example 2 were similar to those in Example 1.

Thereafter, a black photoresist liquid of CB-LMA was prepared by the method described in Example 1-2. In the black photoresist liquid, the hybrid carbon black had an average diameter of 245 nm. The black photoresist liquid had a viscosity of 8.23 cP when the viscometer rotated at 50 rpm. The black photoresist liquid had a viscosity of 9.18 cP when the viscometer rotated at 20 rpm.

Example 3

Example 3 was similar to Example 1, with a difference being that the styrene/LMA molar ratio was changed to 17/1. The other starting material amounts and processing factors in Example 2 were similar to that in Example 1.

Thereafter, a black photoresist liquid of CB-LMA was prepared by the method described in Example 1-2. In the black photoresist liquid, the hybrid carbon black had an average diameter of 238 nm. The black photoresist liquid had a viscosity of 7.9 cP when the viscometer rotated at 50 rpm. The black photoresist liquid had a viscosity of 8.56 cP when the viscometer rotated at 20 rpm.

The properties of the black photoresist liquids prepared from the hybrid carbon blacks (CB-LMA) in Examples 1 to 3 are compared as tabulated in Table 1.

TABLE 1

|  | Example 1-2 | Example 2 | Example 3 |
| --- | --- | --- | --- |
| Styrene/DVB(Molar ratio) | 70/1 | 100/1 | 70/1 |
| Styrene/LMA (Molar ratio) | 23/1 | 23/1 | 17/1 |
| Solid content | Total solid content = 30 wt %, hybrid carbon black solid content = 15 wt % | | |
| Average diameter of hybrid carbon black in black photoresist liquid | 228 nm | 245 nm | 238 nm |
| Viscosity corresponding to 50 rpm (cP) | 8.88 | 8.23 | 7.90 |
| Viscosity corresponding to 20 rpm (cP) | 9.00 | 9.18 | 8.56 |

Example 4 (Hybrid Carbon Black CB-HA)

200 g of de-ionized water, 2.0 g of the pulverized carbon black from Preparation Example 1, and 2.78 g of SDS were put into a reaction bottle (250 mL) to be stirred and mixed to formulate a carbon black dispersion. Subsequently, 0.12 g of AIBN, 1.38 g of hexyl acrylate (HA, commercially available from Aldrich), 21.05 g of styrene, and 0.38 g of DVB were put into a flask to be stirred for forming a homogeneous phase, and then directly poured into the carbon black dispersion to form a mixture. The mixture was heated to 65° C. and reacted at 65° C. for 1 hour under nitrogen, and then heated to 75° C. and reacted at 75° C. for 16 hours, thereby obtaining a hybrid carbon black dispersion, wherein the surface of the carbon black was wrapped by a polymer film. The polymer film had polymer main chains (styrene-DVB-HA copolymer) crosslinked as a network structure, and the dispersion-side chains (long alkyl group) formed of the HA were bonded to the polymer main chains. The as-synthesized hybrid carbon black dispersion had a solid content of 9.58 wt %, and the hybrid carbon black in the hybrid carbon black dispersion had an average diameter of 99 nm. The hybrid carbon black dispersion was further purified and dried by the steps described in Example 1, thereby obtaining a hybrid carbon black powder (CB-HA). The polymer film was polymerized in the following monomer ratios: the styrene and the DVB had a molar ratio of 70/1, and the styrene and the HA had a molar ratio of 23/1.

Example 4-1 (Hybrid Carbon Black Dispersion of CB-HA)

Example 4-1 was similar to Example 1-1, with a difference being that the CB-LMA was changed to CB-HA. In the hybrid carbon black dispersion, the hybrid carbon black had an average diameter of 178 nm. The hybrid carbon black dispersion had a viscosity of 22.1 cP.

Example 4-2 (Black Photoresist Liquid of CB-HA)

Example 4-2 was similar to Example 1-2, with a difference being that the CB-LMA was changed to CB-HA. In the black photoresist liquid of Example 4-2, the hybrid carbon black had an average diameter of 200 nm. The black photoresist liquid had a viscosity of 15.0 cP when the viscometer rotated at 50 rpm. The black photoresist liquid had a viscosity of 19.0 cP when the viscometer rotated at 20 rpm.

Example 5 (Hybrid Carbon Black CB-HMA)

200 g of de-ionized water, 2.0 g of the pulverized carbon black from Preparation Example 1, and 2.78 g of SDS were put into a reaction bottle (250 mL) to be stirred and mixed to formulate a carbon black dispersion. Subsequently, 0.12 g of AIBN, 1.44 g of hexyl methacrylate (HMA, commercially available from Aldrich), 21.05 g of styrene, and 0.38 g of DVB were put into a flask to be stirred for forming a homogeneous phase, and then directly poured into the carbon black dispersion to form a mixture. The mixture was heated to 65° C. and reacted at 65° C. for 1 hour under nitrogen, and then heated to 75° C. and reacted at 75° C. for 16 hours, thereby obtaining a hybrid carbon black dispersion, wherein the surface of the carbon black was wrapped by a polymer film. The polymer film had polymer main chains (styrene-DVB-HMA copolymer) crosslinked as a network structure, and the dispersion-side chains (long alkyl group) formed of the HMA were bonded to the polymer main chains. The hybrid carbon black dispersion had a solid content of 8.1 wt %, and the hybrid carbon black in the hybrid carbon black dispersion had an average diameter of 120 nm. The hybrid carbon black dispersion was further purified and dried by the steps described in Example 1, thereby obtaining a hybrid carbon black powder (CB-HMA). The polymer film was polymerized in the following monomer ratios: the styrene and the DVB had a molar ratio of 70/1, and the styrene and the HMA had a molar ratio of 23/1.

Example 5-1 (Hybrid Carbon Black Dispersion of CB-HMA)

Example 5-1 was similar to Example 1-1, with a difference being that the CB-LMA was changed to CB-HMA. In the hybrid carbon black dispersion, the hybrid carbon black had an average diameter of 163 nm. The hybrid carbon black dispersion had a viscosity of 23 cP.

Example 5-2 (Black Photoresist Liquid of CB-HMA)

Example 5-2 was similar to Example 1-2, with a difference being that the CB-LMA was changed to CB-HMA. In the black photoresist liquid of Example 5-2, the hybrid carbon black had an average diameter of 182.2 nm. The black photoresist liquid had a viscosity of 15.2 cP when the viscometer rotated at 50 rpm. The black photoresist liquid had a viscosity of 17.8 cP when the viscometer rotated at 20 rpm.

Comparative Example 1 (Hybrid Carbon Black CB-LA)

100 g of de-ionized water, 1.0 g of the pulverized carbon black from Preparation Example 1, and 1.4 g of SDS were put into a reaction bottle (250 mL) to be stirred and mixed to formulate a carbon black dispersion. Subsequently, 0.054 g of AIBN, 1.02 g of lauryl acrylate (LA, commercially available from Aldrich), 10.63 g of styrene, and 0.19 g of DVB were put into a flask to be stirred for forming a homogeneous phase, and then directly poured into the carbon black dispersion to form a mixture. The mixture was heated to 65° C. and reacted at 65° C. for 1 hour under nitrogen, and then heated to 75° C. and reacted at 75° C. for 16 hours, thereby obtaining a hybrid carbon black dispersion, wherein the surface of the carbon black was wrapped by a polymer film. The polymer film had polymer main chains (styrene-DVB-LA copolymer) crosslinked as a network structure, and the dispersion-side chains (long alkyl group) formed of the LA were bonded to the polymer main chains. The hybrid carbon black dispersion had a solid content of 11.34 wt %, and the hybrid carbon black in the hybrid carbon black dispersion had an average diameter of 92 nm. The hybrid carbon black dispersion was further purified and dried by the steps described in Example 1, thereby obtaining a hybrid carbon black powder (CB-LA). The polymer film was polymerized in the following monomer ratios: the styrene and the DVB had a molar ratio of 70/1, and the styrene and the LA had a molar ratio of 23/1.

Comparative Example 1-1 (Hybrid Carbon Black Dispersion of CB-LA)

Comparative Example 1-1 was similar to Example 1-1, with a difference being that the CB-LMA was changed to CB-LA. In the hybrid carbon black dispersion of Comparative Example 1-1, the hybrid carbon black had an average diameter of 277 nm. The hybrid carbon black dispersion had a viscosity of 21.3 cP.

Comparative Example 1-2 (Black Photoresist Liquid of CB-LA)

Comparative Example 1-2 was similar to Example 1-2, with a difference being that the CB-LMA was changed to CB-LA. In the black photoresist liquid of Comparative Example 1-2, the hybrid carbon black had an average diameter of 257 nm. The black photoresist liquid had a viscosity of 49.1 cP when the viscometer rotated at 50 rpm. The black photoresist liquid had a viscosity of 75.4 cP when the viscometer rotated at 20 rpm.

Comparative Example 2 (Hybrid Carbon Black CB-SMA)

200 g of de-ionized water, 2.0 g of the pulverized carbon black from Preparation Example 1, and 2.78 g of SDS were put into a reaction bottle (250 mL) to be stirred and mixed to formulate a carbon black dispersion. Subsequently, 0.12 g of AIBN, 2.99 g of stearyl methacrylate (SMA, commercially available from Aldrich), 21.05 g of styrene, and 0.38 g of DVB were put into a flask to be stirred for forming a homogeneous phase, and then directly poured into the carbon black dispersion to form a mixture. The mixture was heated to 65° C. and reacted at 65° C. for 1 hour under nitrogen, and then heated to 75° C. and reacted at 75° C. for 16 hours, thereby obtaining a hybrid carbon black dispersion, wherein the surface of the carbon black was wrapped by a polymer film. The polymer film had polymer main chains (styrene-DVB-SMA copolymer) crosslinked as a network structure, and the dispersion-side chains (long alkyl group) formed of the SMA were bonded to the polymer main chains. The hybrid carbon black dispersion had a solid content of 8.05 wt %, and the hybrid carbon black in the hybrid carbon black dispersion had an average diameter of 106 nm. The hybrid carbon black dispersion was further purified and dried by the steps described in Example 1, thereby obtaining a hybrid carbon black powder (CB-SMA). The polymer film was polymerized in the following monomer ratios: the styrene and the DVB had a molar ratio of 70/1, and the styrene and the SMA had a molar ratio of 23/1.

Comparative Example 2-1 (Hybrid Carbon Black Dispersion of CB-SMA)

Comparative Example 2-1 was similar to Example 1-1, with a difference being that the CB-LMA was changed to CB-SMA. In the hybrid carbon black dispersion of Comparative Example 2-1, the hybrid carbon black had an average diameter of 255 nm. The hybrid carbon black dispersion had a viscosity of 32.4 cP.

Comparative Example 2-2 (Black Photoresist Liquid of CB-SMA)

Comparative Example 2-2 was similar to Example 1-2, with a difference being that the CB-LMA was changed to CB-SMA. In the black photoresist liquid of Comparative Example 2-2, the hybrid carbon black had an average diameter of 279.3 nm. The black photoresist liquid had a viscosity of 58.3 cP when the viscometer rotated at 50 rpm. The black photoresist liquid had a viscosity of 89.4 cP when the viscometer rotated at 20 rpm.

Comparative Example 3

200 g of de-ionized water, 2.12 g of the pulverized carbon black from Preparation Example 1, and 2.78 g of SDS were put into a reaction bottle (250 mL) to be stirred and mixed to formulate a carbon black dispersion. Thereafter, a black photoresist liquid of the carbon black was prepared according to the method described in Example 1-2. In the black photoresist liquid of Comparative Example 3, the hybrid carbon black had an average diameter of 185.4 nm. The black photoresist liquid had a viscosity of 106.5 cP when the viscometer rotated at 50 rpm. The black photoresist liquid had a viscosity of 106.5 cP when the viscometer rotated at 20 rpm.

The properties of the black photoresist liquids in Example 1, Example 4, Example 5, Comparative Example 1, and Comparative Example 2 are compared as tabulated in Table 2.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A hybrid carbon black, comprising:
   a carbon black core; and
   a polymer film wrapping an entire surface of the carbon black core,
   wherein the polymer film includes a network of a plurality of polymer main chains crosslinked each other, and a plurality of dispersion-side chains bonded to the polymer main chains,
   wherein the dispersion-side chains come from an acrylate monomer with a chemical structure of:

wherein when n=4-7, $R^1$ is H or $CH_3$; and
   when n=8-14, $R^1$ is $CH_3$, and
   wherein the carbon black core has a mass-fractal dimension of 2 to 3 and a surface fractal dimension of 2 to 2.5.

2. The hybrid carbon black as claimed in claim 1, wherein the polymer film is copolymerized of a styrene monomer, a crosslinking agent, and the acrylate monomer.

3. The hybrid carbon black as claimed in claim 2, wherein the styrene monomer and the crosslinking agent have a molar ratio of 70:1 to 100:1.

4. The hybrid carbon black as claimed in claim 2, wherein the styrene monomer and the acrylate monomer have a molar ratio of 17:1 to 23:1.

5. The hybrid carbon black as claimed in claim 1, wherein the polymer film and the carbon black core have a weight ratio of 5:1 to 30:1.

6. The hybrid carbon black as claimed in claim 1, wherein a thickness of the polymer film and a diameter of the carbon black core have a ratio of 0.5:1 to 1.5:1.

7. The hybrid carbon black as claimed in claim 1, having an average diameter of 40 nm to 150 nm.

TABLE 2

|  | Example 1-2 | Example 4-2 | Example 5-2 | Comparative Example 1-2 | Comparative Example 2-2 | Comparative Example 3 |
|---|---|---|---|---|---|---|
| Dispersion-side chains | LMA | HA | HMA | LA | SMA | None |
| Average diameter of hybrid carbon black in black photoresist liquid | 228 nm | 200 nm | 182 nm | 257 nm | 279 nm | 185 nm |
| Viscosity corresponding to 50 rpm (cP) | 8.88 | 15.0 | 15.2 | 49.1 | 58.3 | 106.5 |
| Viscosity corresponding to 20 rpm (cP) | 9.00 | 19.0 | 17.8 | 75.4 | 89.4 | 106.5 |

8. A coating composition, comprising the hybrid carbon black as claimed in claim 1.

9. The coating composition as claimed in claim 8, wherein the coating composition is a photoresist.

* * * * *